United States Patent
Milano et al.

(10) Patent No.: US 9,383,425 B2
(45) Date of Patent: Jul. 5, 2016

(54) METHODS AND APPARATUS FOR A CURRENT SENSOR HAVING FAULT DETECTION AND SELF TEST FUNCTIONALITY

(71) Applicants: Shaun D. Milano, Dunbarton, NH (US); Thomas Kerdraon, Lenzkirch (DE); Georges El Bacha, Londonderry, NH (US); Michael Gaboury, Burnsville, MN (US); Michael C. Doogue, Bedford, NH (US)

(72) Inventors: Shaun D. Milano, Dunbarton, NH (US); Thomas Kerdraon, Lenzkirch (DE); Georges El Bacha, Londonderry, NH (US); Michael Gaboury, Burnsville, MN (US); Michael C. Doogue, Bedford, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 468 days.

(21) Appl. No.: 13/730,100

(22) Filed: Dec. 28, 2012

(65) Prior Publication Data

US 2014/0184200 A1    Jul. 3, 2014

(51) Int. Cl.
| | |
|---|---|
| *G01R 35/00* | (2006.01) |
| *G01R 33/07* | (2006.01) |
| *G01R 31/28* | (2006.01) |
| *G01H 1/00* | (2006.01) |
| *G01R 1/00* | (2006.01) |
| *B60L 1/00* | (2006.01) |
| *H02H 1/00* | (2006.01) |

(52) U.S. Cl.
CPC ............ *G01R 35/00* (2013.01); *G01R 31/2829* (2013.01); *G01R 33/072* (2013.01); *B60L 1/00* (2013.01); *G01H 1/00* (2013.01); *G01R 1/00* (2013.01); *H02H 1/00* (2013.01)

(58) Field of Classification Search
CPC ............... G01R 1/00; H02H 1/00; H02J 1/00; B60L 1/00; H01H 1/00; H01L 21/00; H01R 3/00; G01H 1/00
USPC ........................................................ 324/202
See application file for complete search history.

(56) References Cited

U.S. PATENT DOCUMENTS

| | | | |
|---|---|---|---|
| 4,236,832 A | 12/1980 | Komatsu et al. | |
| 4,438,347 A | 3/1984 | Gehring | |
| 4,752,733 A | 6/1988 | Petr et al. | |
| 4,758,943 A | 7/1988 | Aström et al. | |
| 4,760,285 A | 7/1988 | Nelson | |
| 4,823,075 A | 4/1989 | Alley | |
| 4,833,406 A | 5/1989 | Foster | |

(Continued)

FOREIGN PATENT DOCUMENTS

| | | |
|---|---|---|
| DE | 38 29 815 A1 | 3/1990 |
| DE | 195 39 458 A1 | 4/1997 |

(Continued)

OTHER PUBLICATIONS

Invitation to Pay Additional Fees and, Where Applicable, Protest Fee, PCT/US2013/071648, date of mailing Apr. 3, 2014, 7 pages.

(Continued)

*Primary Examiner* — Huy Q Phan
*Assistant Examiner* — Temilade Rhodes-Vivour
(74) *Attorney, Agent, or Firm* — Daly, Crowley, Mofford & Durkee, LLP

(57) ABSTRACT

Methods and apparatus for an integrated circuit having a magnetic sensing element, a fault detection module including circuitry to detect a fault condition and to self-test operation of the circuitry to detect the fault. The integrated circuit includes a fault pin to indicate the fault condition.

18 Claims, 10 Drawing Sheets

(56) References Cited

U.S. PATENT DOCUMENTS

| | | | |
|---|---|---|---|
| 4,970,411 A | 11/1990 | Halg et al. | |
| 5,038,246 A * | 8/1991 | Durivage, III | H02H 1/063 361/102 |
| 5,247,278 A | 9/1993 | Pant et al. | |
| 5,329,416 A | 7/1994 | Ushiyama et al. | |
| 5,412,255 A | 5/1995 | Wallrafen | |
| 5,424,558 A | 6/1995 | Borden et al. | |
| 5,469,058 A | 11/1995 | Dunnam | |
| 5,521,501 A | 5/1996 | Dettmann et al. | |
| 5,621,319 A | 4/1997 | Bilotti et al. | |
| 5,640,090 A | 6/1997 | Furuya et al. | |
| 6,011,770 A | 1/2000 | Tan | |
| 6,014,091 A * | 1/2000 | Noltemeyer | G01R 31/2829 341/15 |
| 6,262,871 B1 * | 7/2001 | Nemir | G01R 31/327 324/424 |
| 6,351,506 B1 | 2/2002 | Lewicki | |
| 6,392,478 B1 | 5/2002 | Mulder et al. | |
| 6,436,748 B1 | 8/2002 | Forbes et al. | |
| 6,437,558 B2 | 8/2002 | Li et al. | |
| 6,456,085 B1 | 9/2002 | Dietl et al. | |
| 6,853,178 B2 | 2/2005 | Hayat-Dawoodi | |
| 6,896,407 B2 | 5/2005 | Nomiyama et al. | |
| 6,917,321 B1 | 7/2005 | Haurie et al. | |
| 7,038,448 B2 | 5/2006 | Schott et al. | |
| 7,190,784 B2 | 3/2007 | Li | |
| 7,259,545 B2 | 8/2007 | Stauth et al. | |
| 7,292,095 B2 | 11/2007 | Burt et al. | |
| 7,319,319 B2 | 1/2008 | Jones et al. | |
| 7,323,870 B2 | 1/2008 | Tatschl et al. | |
| 7,325,175 B2 | 1/2008 | Momtaz | |
| 7,425,821 B2 | 9/2008 | Monreal et al. | |
| 7,474,093 B2 | 1/2009 | Ausserlechner | |
| 7,518,354 B2 | 4/2009 | Stauth et al. | |
| 7,605,647 B1 | 10/2009 | Romero et al. | |
| 7,635,993 B2 * | 12/2009 | Boeve | 326/136 |
| 7,694,200 B2 | 4/2010 | Forrest et al. | |
| 7,701,208 B2 | 4/2010 | Nishikawa | |
| 7,729,675 B2 | 6/2010 | Krone | |
| 7,746,056 B2 | 6/2010 | Stauth et al. | |
| 7,746,065 B2 | 6/2010 | Pastre et al. | |
| 7,764,118 B2 | 7/2010 | Kusuda et al. | |
| 7,769,110 B2 | 8/2010 | Momtaz | |
| 7,800,389 B2 | 9/2010 | Friedrich et al. | |
| 7,923,996 B2 | 4/2011 | Doogue et al. | |
| 7,936,144 B2 | 5/2011 | Vig et al. | |
| 7,961,823 B2 | 6/2011 | Kolze et al. | |
| 7,990,209 B2 | 8/2011 | Romero | |
| 8,030,918 B2 | 10/2011 | Doogue et al. | |
| 8,128,549 B2 * | 3/2012 | Testani et al. | 600/13 |
| 8,134,358 B2 | 3/2012 | Charlier et al. | |
| 8,447,556 B2 | 5/2013 | Friedrich et al. | |
| 8,577,634 B2 | 11/2013 | Donovan et al. | |
| 8,754,640 B2 | 6/2014 | Vig et al. | |
| 2002/0084923 A1 | 7/2002 | Li | |
| 2003/0038675 A1 | 2/2003 | Gailus et al. | |
| 2003/0102909 A1 | 6/2003 | Motz | |
| 2003/0164711 A1 | 9/2003 | Ishida | |
| 2003/0234652 A1 * | 12/2003 | Bald | G01R 35/00 324/551 |
| 2004/0056647 A1 | 3/2004 | Stauth et al. | |
| 2005/0038623 A1 | 2/2005 | Hammerschmidt | |
| 2005/0183489 A1 | 8/2005 | Weinberg et al. | |
| 2006/0125622 A1 * | 6/2006 | Baldwin | H01H 83/04 340/514 |
| 2006/0152210 A1 | 7/2006 | Mangtani et al. | |
| 2006/0202692 A1 | 9/2006 | Tatschl et al. | |
| 2007/0110199 A1 | 5/2007 | Momtaz et al. | |
| 2007/0247141 A1 | 10/2007 | Pastre et al. | |
| 2007/0285089 A1 | 12/2007 | Ibuki et al. | |
| 2008/0094055 A1 | 4/2008 | Monreal et al. | |
| 2008/0137784 A1 | 6/2008 | Krone | |
| 2008/0238410 A1 | 10/2008 | Charlier et al. | |
| 2009/0001964 A1 | 1/2009 | Strzalkowski | |
| 2009/0001972 A1 | 1/2009 | Fernandez et al. | |
| 2009/0085706 A1 | 4/2009 | Baarman et al. | |
| 2009/0212765 A1 | 8/2009 | Doogue et al. | |
| 2009/0251134 A1 | 10/2009 | Uenoyama | |
| 2009/0278711 A1 * | 11/2009 | Lohberg et al. | G01D 5/145 341/11 |
| 2010/0211347 A1 | 8/2010 | Friedrich et al. | |
| 2011/0018533 A1 | 1/2011 | Cesaretti et al. | |
| 2011/0048102 A1 | 3/2011 | Fernandez et al. | |
| 2011/0074016 A1 * | 3/2011 | Narita | 257/737 |
| 2011/0298448 A1 | 12/2011 | Foletto et al. | |
| 2012/0274314 A1 | 11/2012 | Cesaretti et al. | |
| 2012/0313635 A1 | 12/2012 | Daubert | |
| 2013/0214774 A1 | 8/2013 | Cesaretti et al. | |
| 2013/0300406 A1 | 11/2013 | Pepka et al. | |
| 2013/0335069 A1 | 12/2013 | Vig et al. | |
| 2014/0184200 A1 | 7/2014 | Milano et al. | |
| 2014/0266181 A1 | 9/2014 | Milano et al. | |

FOREIGN PATENT DOCUMENTS

| | | |
|---|---|---|
| DE | 10 2006 037 226 A1 | 2/2008 |
| DE | 10 2007 041 230 B3 | 4/2009 |
| EP | 0289414 A2 | 11/1988 |
| EP | 0289414 A3 | 11/1988 |
| EP | 0357013 A2 | 3/1990 |
| EP | 0357013 A3 | 3/1990 |
| EP | 1637898 A1 | 3/2006 |
| EP | 1679524 A1 | 7/2006 |
| EP | 1850143 A1 | 10/2007 |
| EP | 2 211 147 A1 | 7/2010 |
| GB | 2276727 A | 10/1994 |
| JP | H06-26968 | 2/1994 |
| WO | WO 9602849 A1 | 2/1996 |
| WO | WO 2004/072672 | 8/2004 |
| WO | WO 2006/056829 | 6/2006 |
| WO | WO 2007/138508 A1 | 12/2007 |
| WO | WO 2008/048379 A1 | 4/2008 |
| WO | WO 2009/012006 A1 | 1/2009 |
| WO | WO 2009/108422 A2 | 9/2009 |
| WO | WO 2009/108422 A3 | 9/2009 |
| WO | WO 2010/096367 A1 | 8/2010 |
| WO | WO 2011/011479 | 1/2011 |
| WO | WO 2012/164915 | 12/2012 |

OTHER PUBLICATIONS

PCT Search Report of the ISA for PCT/US2013/071648 dated Jul. 23, 2014 9 pages.

PCT Written Opinion of the ISA for PCT/US2013/071648 dated Jul. 23, 2014 14 pages.

ACS710 "120 kHz Bandwidth, High Voltage Isolation Current Sensor with Integrated Overcurrent Detection", 2007, Allegro Microsystems Inc. 18 pages.

U.S. Appl. No. 14/337,613, filed Jul. 22, 2014, Scheller et al.

U.S. Appl. No. 14/506,024, filed Oct. 3, 2014, Petrie et al.

U.S. Appl. No. 13/095,371, filed Apr. 27, 2011, Cesaretti et al.

U.S. Appl. No. 13/398,127, filed Jan. 16, 2012, Cesaretti et al.

U.S. Appl. No. 13/743,451, filed Jan. 17, 2013, Friedrich et al.

EP Official Communication; dated Feb. 23, 2012; for EP. Pat. App. No. 10739429.8; 2 pages.

European Notice of Allowance; dated Jan. 4, 2013; for European Pat. App. No. 10739429.8; 7 pages.

European Response to Written Opinion dated Sep. 4, 2012 for European Patent Application No. 10739429.8, 11 pages.

Letter from NTD Patent and Trademark Agency Ltd.; dated Jan. 19, 2013; enclosing Response to Official Action; for Chinese Pat. App. No. 200980106535.4; 13 pages.

Letter to NTD Patent and Trademark Agency Ltd.; dated Dec. 11, 2012; with instructions to file Response to Official Action; for Chinese Pat. App. No. 200980106535.4; 3 pages.

Office Action dated Jul. 6, 2012; for U.S. Appl. No. 12/706,318; 29 pages.

PCT International Preliminary Report on Patentability and Written Opinion of the ISA; dated Feb. 2, 2012; for PCT Patent Application No. PCT/US2010/042694; 11 sheets.

(56) References Cited

OTHER PUBLICATIONS

PCT International Preliminary Report on Patentability and Written Opinion of the ISA for PCT Pat. App. No. PCT/US2010/024256; dated Sep. 1, 2011; 9 pages.
PCT Search Report and Written Opinion of the ISA for PCT Pat. App. No. PCT/US2012/032315; dated Jun. 22, 2012; 18 pages.
PCT Search Report and Written Opinion of the ISA for PCT/US2010/042694 dated Sep. 27, 2010.
Sargent; "Switched-capacitor IC controls feedback loop;" EDN; Design Ideas; Feb. 17, 2000; pp. 154 and 156.
U.S. Notice of Allowance dated Dec. 10, 2012 for U.S. Appl. No. 12/706,318, 9 pages.
Wu, et al.; "A Chopper Current-Feedback Instrumentation Amplifier with a 1mHz 1/f Noise Corner and an AC-Coupled Ripple-Reduction Loop;" IEEE International Solid-State Circuits Conference; Feb. 10, 2009; pp. 322-324.
U.S. Appl. No. 12/840,324, filed Jul. 21, 2010, Juan Manuel Cesaretti, et al.
U.S. Appl. No. 12/793,163, filed Jun. 3, 2010, Foletto et al.
Office Action dated Sep. 11, 2012 from U.S. Appl. No. 12/840,324, 30 pages.
U.S. Response filed Dec. 11, 2012 to Office Action dated Sep. 11, 2012 for U.S. Appl. No. 12/840,324, 15 pages.
Final Office Action dated Feb. 12, 2013 from U.S. Appl. No. 12/840,324, 19 pages.
U.S. Appl. No. 13/095,371, filed Apr. 27, 2011, Juan Manuel Cesaretti, et al.
SAE International Surface Vehicle Information Report SAE J2716; SENT—Single Edge Nibble Transmission for Automotive Applications; Jan. 2010; 56 pages.
Ausserlechner et al.; "Compensation of the Piezo-Hall Effect in Integrated Hall Sensors on (100)-Si;" IEEE Sensors Journal, vol. 7, No. 11; Nov. 2007; ISBN: 1530-437X; pp. 1475-1482.
Ausserlechner et al.; "Drift of Magnetic Sensitivity of Small Hall Sensors Due to Moisture Absorbed by the IC-Package;" Proceedings of IEEE Sensors, 2004; vol. 1; Oct. 24, 2004; ISSN:0-7803-8692-2; pp. 455-458.
Ausserlechner; "The piezo-Hall effect in n-silicon for arbitrary crystal orientation;" Proceedings of IEEE Sensors; vol. 3; Oct. 24, 2004; ISBN: 0-7803-8692-2: pp. 1149-1152.
Bahreyni, et al.; "A Resonant Micromachined Magnetic Field Sensor;" IEEE Sensors Journal; vol. 7, No. 9, Sep. 2007; pp. 1326-1334.
Barrettino, et al.; "CMOS-Based Monolithic Controllers for Smart Sensors Comprising Micromembranes and Microcantiievers;" IEEE Transactions on Circuits and Systems-I Regular Papers vol. 64, No. 1; Jan. 2007; pp. 141-152.
Baschirotto et al.; "Development and Analysis of PCB Vector 2-D Magnetic Field Sensor System for Electronic Compass;" IEEE Sensors Journal vol. 6, No. 2; Apr. 2006; pp. 365-371.
Bilotti et al.; "Monolithic Magnetic Hall Sensor Using Dynamic Quadrature Offset Cancellation;" IEEE Journal of Solid-State Circuits; vol. 32, Issue 6; Jun. 1997; pp. 829-836.
Demierre, et al.; "Reference Magnetic Actuator for Self-Calibration of a Very Small Hall Sensor Array;" Sensors and Actuators A97-98; Apr. 2002; pp. 39-46.
Frick, et al.; "CMOS Microsystem for AC Current Measurement with Galvanic Isolation;" IEEE Sensors Journal; vol. 3, No. 6; Dec. 2003; pp. 752-760.
Halg; "Piezo-Hall Coefficients of n-Type Silicon;" Journal of Applied Physics; vol. 64, No. 1; Jul. 1, 1988; pp. 276-282.
Hosticka; "CMOS Sensor Systems;" Sensors and Actuators A66; Apr. 1998; pp. 335-341.
Kanda et al.; "The Piezo-Hall Effect in n-Silicon;" 22$^{nd}$ International Conference on the Physics of Semiconductors; vol. 1, Jan. 1995; pp. 89-92.
Krammerer et al.: "A Hall effect sensors network insensitive to mechanical stress;" Proceedings of IEEE Sensors; vol. 3, Oct. 2004; pp. 1071-1074.

Mangnani et al.; "Mechanical Stress Measurement Electronics Based on Piezo-Resistive and Piezo-Hall Effects;" 9$^{th}$ International Conference on Electronics, Circuits and Systems 2002; vol. 1; SBN: 0-7803-7596-3; Dec. 2002; pp. 363-366.
Manic et al.; "Short and Long-Term Stability Problems of Hall Plates in Plastic Packages;" IEEE 38$^{th}$ Annual International Reliability Physics Symposium; Apr. 2000; pp. 225-230.
Manic; "Drift in Silicon Integrated Sensors and Circuits Due to the Thermo-Mechnical Stresses;" Lausanne, Ecole Polytechnigue Federate De Lausanne 2000; 170 pages.
Motz et al.; "An Integrated Magnetic Sensor with Two Continuous-Time ΔΣ-Converters and Stress Compensation Capability;" IEEE International Solid-State Circuits Conference; Digest of Technical Papers; Feb. 6, 2006; ISBN: 1-4244-0079-1; pp. 1151-1160.
Motz, et al.; "A Chopped Hall Sensor with Small Jitter and Programmable "True Power-On" Function;" IEEE Journal of Solid-State Circuits; vol. 40, No. 7, Jul. 2005; pp. 1533-1540.
Motz, et al.; "An Integrated Hall Sensor Platform Design for Position, Angle and Current Sensing;" IEEE Sensors 2006; Exco, Daegu, Korea / Oct. 22-25, 2006; pp. 1008-1011.
Munter; "A Low-offset Spinning-current Hall Plate;" Sensors and Actuators A21-A23; 1990; pp. 742-746.
Munter; "Electronic Circuitry for a Smart Spinning-current Hall Plate with Low Offset;" Sensors and Actuators A; Jun. 1991; pp. 747-751.
Partin et al.; "Temperature Stable Hall Effect Sensors;" IEEE Sensors Journal, vol. 6, No. 1; Feb. 2006; pp. 106-110.
Pastre, et al.; "A Hall Sensor Analog Front End for Current Measurement with Continuous Gain Calibration," IEEE Sensors Journal; vol. 7, No. 5; May 2007; pp. 860-867.
Pastre, et al.; "A Hall Sensor-Based Current Measurement Microsystem With Continuous Gain Calibration;" Research in Microelectronics and Electronics, IEEE vol. 2; Jul. 25, 2005; ISBN: 0-7803-9345-7; pp. 95-98.
PCT International Preliminary Report on Patentability and Written Opinion mailed Sep. 10, 2010 for PCT/US2009/031776.
PCT Search Report and Written Opinion of the ISA for PCT/US2009/031776 dated Oct. 23, 2009.
PCT Search Report and Written Opinion of the ISA for PCT/US2010/024256 dated Aug. 11, 2010.
Popovic; "Sensor Microsystems;" Proc. 20$^{th}$ International Conference on Microelectronics (MWIL 95); vol. 2, NIS, Serbia, Sep. 12-14, 1995; pp. 531-537.
Preliminary Amendment flied on Oct. 5, 2010 for U.S. Appl. No. 12/706,318.
PTO Notice of Allowance dated Feb. 11, 2011 for U.S. Appl. No. 12/037,393.
PTO Notice of Allowance dated Jul. 19, 2011 for U.S. Appl. No. 12/959,672.
PTO Office Action dated Feb. 2, 2011 from U.S. Appl. No. 12/959,672.
Randhawa; "Monolithic Integrated Hall Devices in Silicon Circuits;" Microelectronics Journal; vol. 12, No. 6; Sep. 14-17, 1981; pp. 24-29.
Ruther et al.; "Integrated CMOS-Based Sensor Array for Mechanical Stress Mapping," 5$^{th}$ IEEE Conference on Sensors, Oct. 2007; pp. 1131-1134.
Ruther et al.; "Theromagnetic Residual Offset in Integrated Hall Plates;" IEEE Sensors Journal; vol. 3, No. 6; Dec. 2003; pp. 693-699.
Schneider; "Temperature Calibration of CMOS Magnetic Vector Probe for Contactless Angle Measurement System," IEDM 1998 pp. 533-536.
Schott et al.; "Linearizing Integrated Hall Devices," 1997 International Conference on Solid-State Sensors and Actuators, Jun. 16-19, 1997; pp. 393-396.
Schott, et al.; "CMOS Single-Chip Electronic Compass with Microcontroller;" IEEE Journal of Solid-State Circuits; vol. 42, No. 12; Dec. 2007; pp. 2923-2933.
Simon et al.; "Autocalibration of Silicon Hall Devices;" 8$^{th}$ International Conference on Solid-State Sensors and Actuators; vol. 2; Jun. 25, 1995; pp. 237-240.

(56) References Cited

OTHER PUBLICATIONS

Steiner et al.; "Double-Hall Sensor with Self-Compensate Offset;" International Electron Devices Meeting; Dec. 7, 1997; ISBN: 0-7803-4100-7; pp. 911-914.

Steiner et al; Offset Reduction in Hall Devices by Continuous Spinning Current Method; Sensors and Actuators A66; 1998; pp. 167-172.

Stellrecht et al.; Characterization of Hygroscopic Swelling Behavior of Mold Compounds and Plastic Packages; IEEE Transactions on Components and Packaging Technologies; vol. 27, No. 3; Sep. 2004; pp. 499-506.

Tian et al.; "Multiple Sensors on Pulsed Eddy-Current Detection for 3-D Subsurface Crack Assessment;" IEEE Sensors Journal, vol. 5, No. 1; Feb. 2005; pp. 90-96.

Trontelj et al; "CMOS Integrated Magnetic Field Source Used as a Reference in Magnetic Field Sensors on Common Substrate;" WEP 1-6; IMTC; May 1994; pp. 461-463.

Udo; "Limits of Offset Cancellation by the Principle of Spinning Current Hall Probe;" Proceedings of IEEE Sensors; Oct. 2004; pp. 1117-1120.

Zou et al.; "Three-Dimensional Die Surface Stress Measurements in Delaminated and Non-Delaminated Plastic Packages;" 48th Electronic Components and Technology Conference; May 25, 1998; pp. 1223-1234.

U.S. Appl. No. 12/037,393, filed Feb. 26, 2008, Michael C. Doogue, et al.

U.S. Appl. No. 12/959,672, filed Dec. 3, 2010, Michael C. Doogue, et al.

PCT International Preliminary Report on Patentability and Written Opinion of the ISA dated Jul. 9, 2015; for PCT Pat. App. No. PCT/US2013/071648.

U.S. Appl. No. 14/578,813, filed Dec. 22, 2014, Milano et al.

Invitation to Pay Fees dated Jun. 10, 2015 for PCT Application No. PCT/US2014/071825; 6 pages.

PCT Search Report and Written Opinion of the ISA dated Oct. 8, 2015 for PCT Pat. App. No. PCT/US2014/071825; 19 pages.

PCT Search Report and Written Opinion of the ISA dated Jan. 15, 2016 for PCT Pat. App. No. PCT/US2015/051315; 18 pages.

European Application No. 13812244.5 Response to Office Action filed Feb. 29, 2016, 22 pages.

\* cited by examiner

METHODS AND APPARATUS FOR A CURRENT SENSOR HAVING FAULT DETECTION AND SELF TEST FUNCTIONALITY

BACKGROUND

As known in the art, there are many safety critical applications for magnetic sensor integrated circuits (ICs). There are a variety of specifications directed to improving functional safety and achieving higher overall quality levels and lower field failure rates. For example, test modes for major functional parameters of an IC allow customers to implement test functionality prior to insertion on a printed circuit board, for example. However, after installation in a system or subsystem, such as an automobile, there are limited test opportunities to ensure that components are operating properly.

SUMMARY

Exemplary embodiments of the present invention provide methods and apparatus for a magnetic position sensing IC having a self-test feature for a fault function that improves functional safety levels. For example, test modes are desirable in an automobile to determine if an IC is functioning properly. Such test modes can improve functional safety in certain safety critical applications. The accelerator pedal in an automobile is an example of a safety critical application. If a linear, or nearly linear, magnetic sensing element, such as a Hall or magnetoresistance element, is used in the IC and does not operate properly, a potentially dangerous situation can arise.

Exemplary embodiments of the present invention provide a self-test feature using a fault pin of a linear Hall effect sensor for current sensing applications. A test mode can be invoked manually by a user or automatically, such as at start up, through an input signal under certain operating conditions. The IC responds and validates that the device is working properly. By improving testability, functional safety in current sensing applications is enhanced.

In one embodiment, a current sensor IC includes testing of a fault feature for determining when an applied magnetic field exceeds a threshold value. In a current sensing application, the current creates the magnetic field. When the current exceeds the threshold value, it may be desirable to shut off the source of the current in order to prevent damage to control electronics and hardware, and the like.

In one aspect of the invention, an integrated circuit comprises: a sensing element, fault detection module coupled to the magnetic sensing element, the fault detection module including circuitry to detect a fault condition and to self-test operation of the circuitry to detect the fault condition, and a fault pin to indicate the fault condition.

The integrated circuit can further include one or more of the following features: the sensing element comprises a magnetic sensing element, the magnetic sensing element comprises a Hall element, the sensing element comprises a magnetoresistance element, the fault condition includes a current level above a threshold, the integrated circuit comprises a linear current sensor, the integrated circuit comprises a magnetic field sensor, the fault condition includes a magnetic field above first threshold and/or below a second threshold, the fault pin is configured to receive input/output signals, the output signal to indicate the fault condition and the input signal to receive a self-test initiation signal, the self-test initiation signal comprises a given voltage level applied for at least a given time duration, the given voltage level comprises about vcc/2, the integrated circuit outputs a result of the self-test on the fault pin, the result comprises a voltage level indicative of pass/fail for the self-test, the fault detection module comprises a first comparator to detect a first fault condition and a second comparator to detect a second fault condition, the first fault condition includes a current level below a first threshold, and the second fault condition includes a current level above a second threshold, the self-test is terminated when a magnetic field above a flux threshold is detected, the integrated circuit comprises a package having exactly four pins, the integrated circuit comprises a package having a thickness of less than 1.1 mm, the fault detection module comprises a programmable window comparator, the integrated circuit comprises a linear current sensor, and/or the integrated circuit is disposed in a core of an element in a three-phase power system.

In another aspect of the invention, an integrated circuit comprises: a means for sensing a magnetic field, a means for detecting a fault condition coupled to the means for sensing a magnetic field, a means for self-testing the means for detecting a fault condition, and a means for outputting the detecting fault condition and a result from the self-testing means. In one embodiment, the integrated circuit further comprises the means for outputting the detecting fault condition and the result from the self-testing means comprises an input/output pin and/or the self-testing is terminated when a detected magnetic field is above a flux threshold.

In a further aspect of the invention, a circuit for linear current detection comprises: a sensing element to detect a magnetic field, an output pin to output a signal indicative of the sensed current, a fault detection module to detect a first fault condition and a second fault condition, the first fault condition including a current level above a first threshold and the second fault condition including a current level below a second threshold, the fault detection module including self-test circuitry to test detection of the first and second fault conditions, and a fault pin to output detection of the first and second fault conditions, to output a result of self-test, and to input a self-test initiation signal. In one embodiment, the circuit further includes the self-test is terminated when a detected magnetic field is above a flux threshold and/or the fault detection module comprises a programmable window comparator.

BRIEF DESCRIPTION OF THE DRAWINGS

The foregoing features of this invention, as well as the invention itself, may be more fully understood from the following description of the drawings in which.

DETAILED DESCRIPTION

Figure 1:
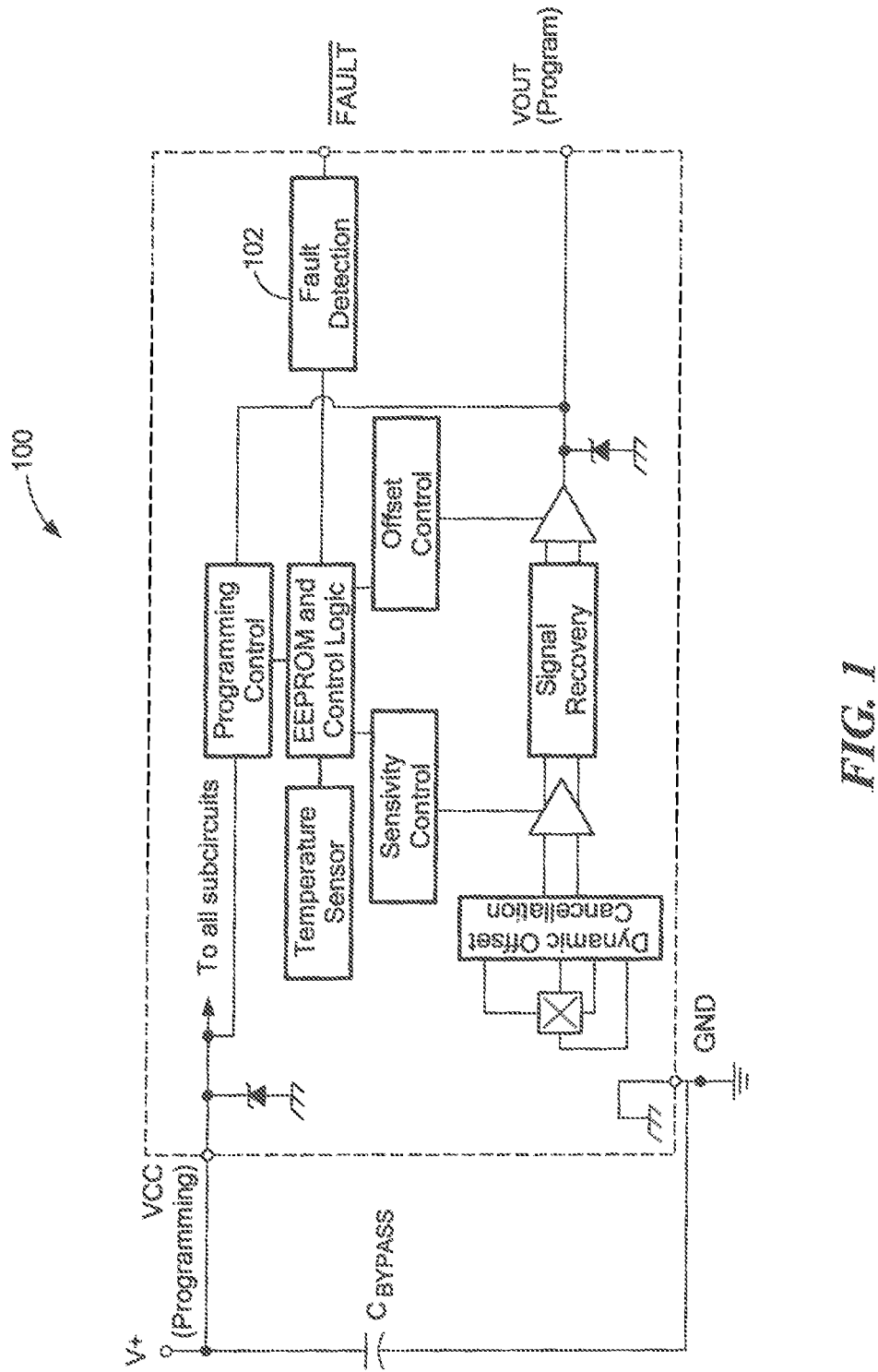
FIG. 1 is a schematic representation of a current sensor having fault detection and self-test functionality in accordance with exemplary embodiments of the invention.

FIG. 1 shows an exemplary embodiment of a programmable linear magnetic sensor IC 100 having a fault detection module 102 in accordance with exemplary embodiments of the invention. In one embodiment, the sensor IC 100 comprises a current sensor linear device with a 120 KHz bandwidth, for example. The sensor IC has an analog output voltage VOUT that is proportional to an applied magnetic field. In one embodiment, the sensor has a linear output that starts at Vcc/2 and swings in positive and negative directions depending on the polarity of the applied field.

The sensor IC senses current in a manner well known in the art. In general, a magnetic field sensing element, such as a Hall element 104, generates a voltage in response to an applied magnetic field. A dynamic offset cancellation module 106 'chops' the signal and a signal recovery module 108 provides an output signal. Sensitivity control 110 and offset control 112 can be used to adjust the signals, as shown and described for example, in U.S. Pat. No. 7,923,996, and U.S. Patent Publication No. US2011/0018533, which are incorporated herein by reference. It is understood that other techniques can be used to meet the needs of a particular application.

The magnetic field sensing element 104 in this and other embodiments can be, but is not limited to, a Hall effect element, a magnetoresistance element, or a magnetotransistor. As is known, there are different types of Hall effect elements, for example, a planar Hall element, a vertical to Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The sensing element 104 may include a single element or, alternatively, may include two or more elements arranged in various configurations, e.g., a half bridge or full (Wheatstone) bridge. Depending on the device type and other application requirements, the sensing element 104 may be a device made of a type IV semiconductor material such as Silicon (Si) or Germanium (Ge), or a type III-V semiconductor material like Gallium-Arsenide (GaAs) or an indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field.

Exemplary embodiments of the invention are applicable to a variety of sensing applications having a range of sending elements. Exemplary sensors include magnetic field, accelerometer, temperature, chemical, biological, strain, piezoelectric, etc. Exemplary embodiments of the invention are applicable to a wide range of applications hi which sensing magnetic fields generated by moving magnets or flowing current are desirable. For example, exemplary embodiments of the invention are useful for HEV (hybrid electric vehicle) inverter applications because it has a 120 KHz operating bandwidth, that allows the sensor to be used in the gap of a core to sense the inverter phase current.

Figure 2:
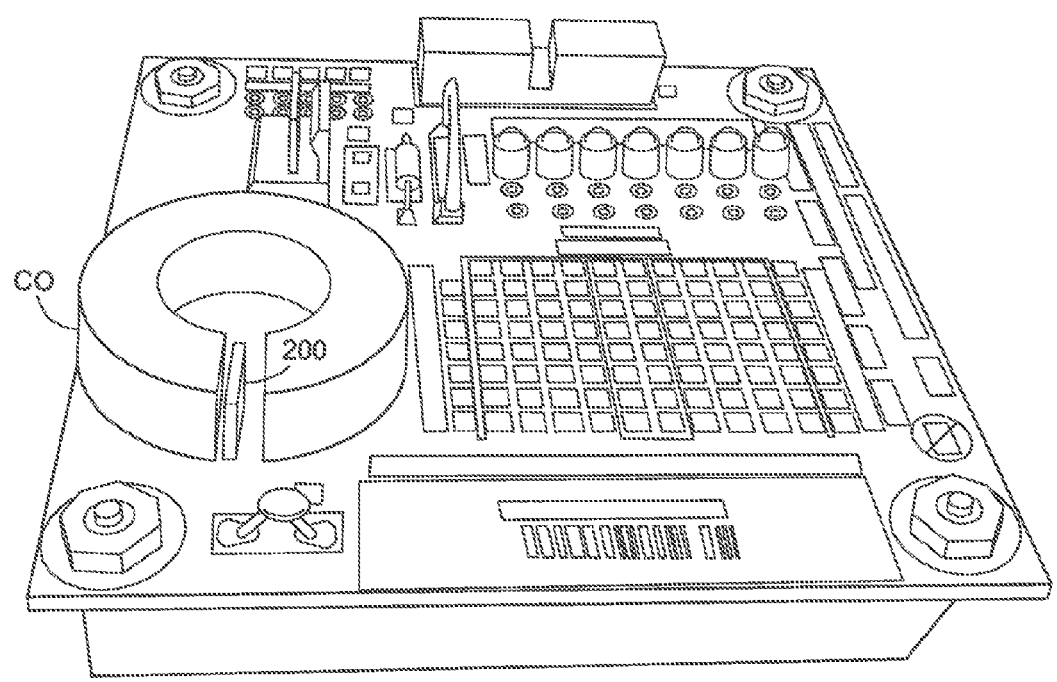
FIG. 2 is a pictorial representation of the current sensor of FIG. 1 in a core.
Figure 3:
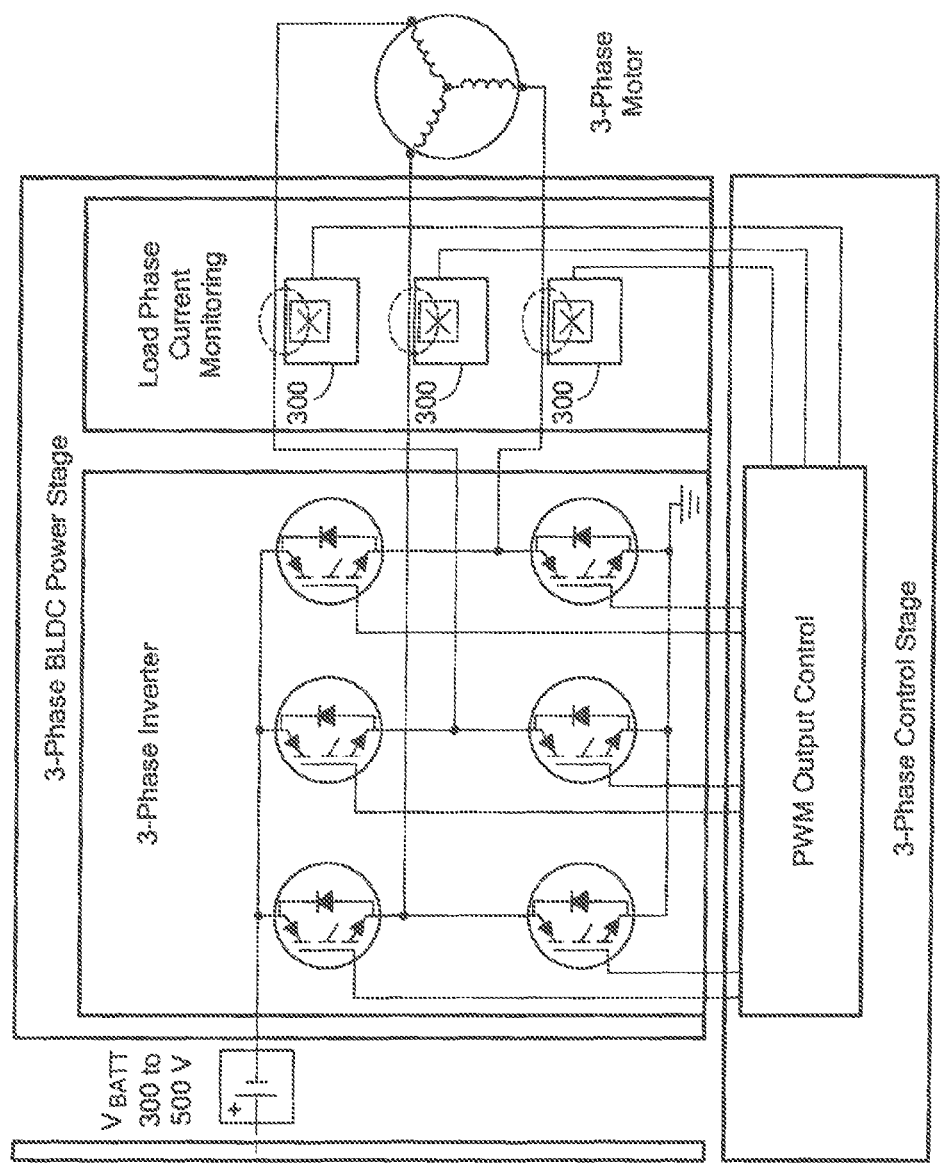
FIG. 3 is a schematic representation of a the current sensor of FIG. 1 forming a part of a three-phase power system.

FIG. 2 shows an exemplary sensor IC 200 having self-test functionality in the gap of a core CO in accordance with exemplary embodiments of the invention. The core CO concentrates the magnetic field flowing in a current carrying conductor that goes through the center of the core. FIG. 3 shows an exemplary current sensor IC 300 having self-test functionality for load phase monitoring in a three-phase application, such as a hybrid electric vehicle (HEV). In this configuration, inventive current sensors are useful in HEV inverter applications.

Figure 4:
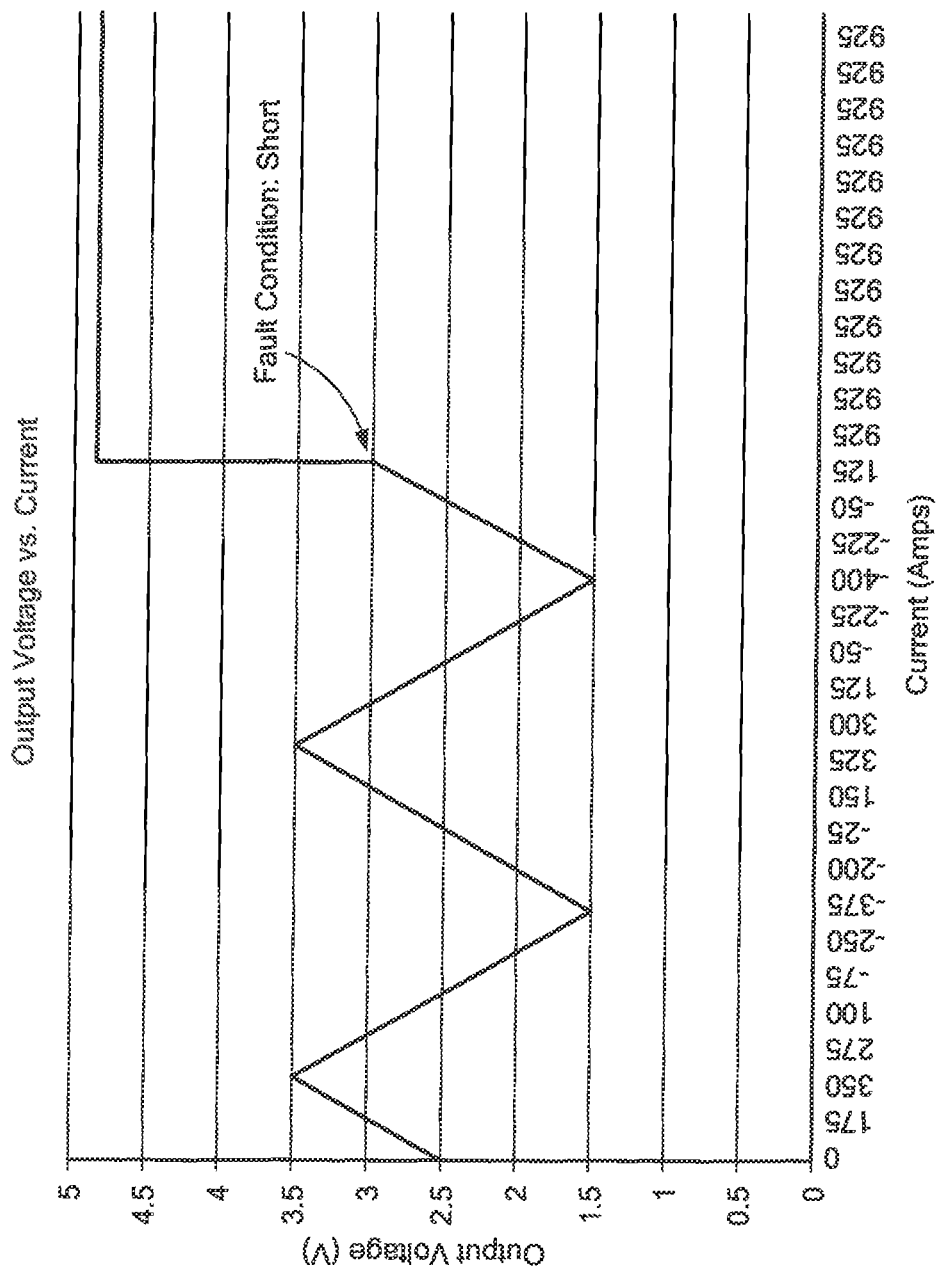
FIG. 4 is a graphical representation of current versus output voltage to show a fault condition.

During an over-current event, such as that might be produced in the case of a short to GND is one of the motor phases of FIG. 3, the output voltage of the inventive sensor IC increases dramatically beyond the normal operating range. In one embodiment, the output voltage of the sensor swings close to the positive or negative rail, depending on the direction of the current flow under the fault condition. FIG. 4 shows a nominal current of about +/−375 Amps and a short that drives the output to about +925 Amps, which is close to the positive rail of the output. As can be seen, the sensor senses both positive and negative fields and currents.

By providing a digital fault output in the presence of faults, such as a short to ground, an interrupt can be generated for the micro controller monitoring the current sensors and controlling a motor or motors.

While an illustrative example is shown for a current sensor (+/−375 A while a 900+ A fault), it is understood that the current generates a magnetic field. In exemplary embodiments, the magnetic field can be programmed to different levels which in a current sensor may represent current levels, but in other applications may represent a magnetic field moving to a level or field outside of a desired range. In addition, while the example is directed to a bidirectional current, and therefore, a bidirectional magnetic field, a unidirectional magnetic field and currents are also contemplated. In addition, in one embodiment, a magnetic field or current level shifted from the zero level as desirable when a linear magnetic field sensor is used to detect the presence of a magnet for a position or height application, for example. Normal operation may be in the range of say, but not limited to, 50 G to 450 G or centered at 200 G+/−150 G. In such a case, a fault may be tripped if the field drops below 50 G or above 450 G, for example.

It is understood that features of exemplary embodiments of the invention may be useful in a variety of sensor types, such as integrated current sensors having a notched conductor, a magnetic field transducer, and a magnetic core, and current sensors having a magnetoresistance element coupled to a device supported on a silicon substrate, such as an amplifier.

Figure 5:
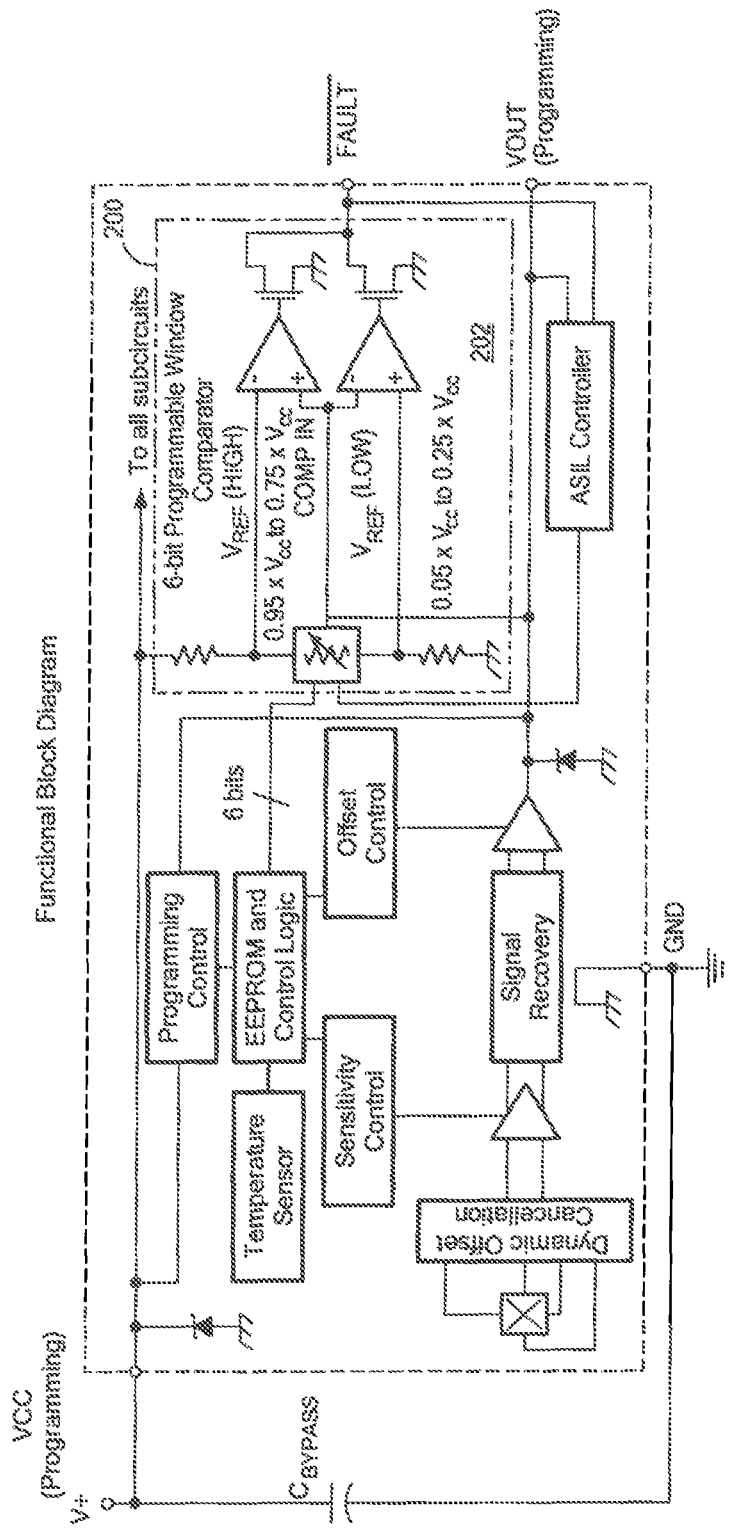
FIG. 5 is a schematic representation showing further detail of the current sensor of FIG. 1.

FIG. 5 shows further detail of an exemplary embodiment of the fault detection module of FIG. 1. The fault detection module 200 monitors the analog output and includes a programmable window comparator module 202 with comparators to generate the fault output FAULT. In one embodiment, the fault detection module 200 detects a fault and activates the fault output FAULT. It is understood that the fault output FAULT can be readily set to the active state for either a positive (logical ONE) or negative (logical ZERO). In the illustrated embodiment, the fault output is shown as active low.

It is understood that the fault output FAULT can provide redundancy with other fault signals in the system, such as from a motor driver or micro-controller. This redundancy improves the overall control system functionality, such as the Automotive Safety Integrity Level (ASIL) applicable to safety levels in safety critical applications in autmobiles. For example, power steering and accelerator pedal position require higher levels of safety defined by ASIL.

In an exemplary embodiment, the fault detection module includes a self-test routine that can be initiated by the user to ensure that the sensor fault function is operating properly. In one embodiment, self-test is initiated by providing a given voltage level on the FAULT pin.

Figure 6:
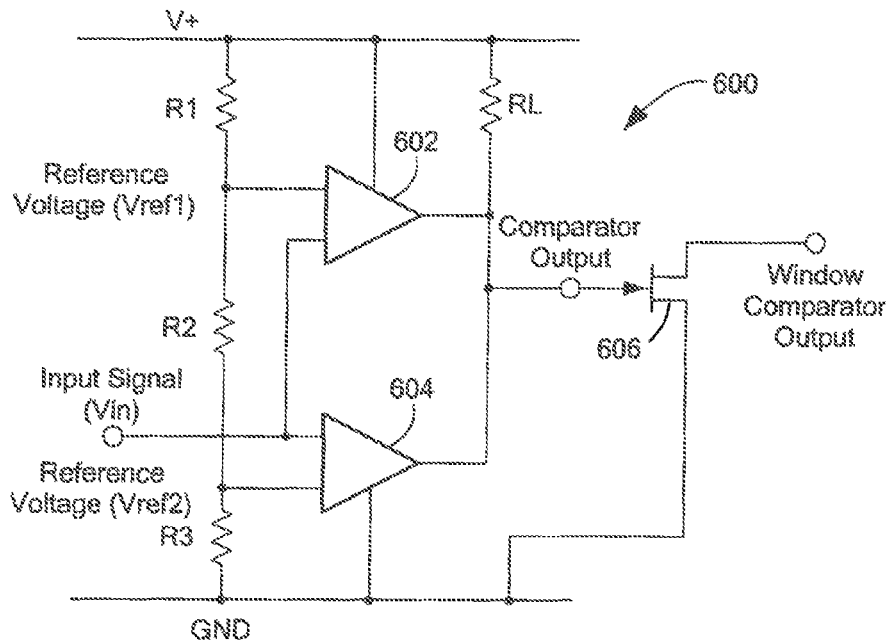
FIG. 6 is a circuit diagram of an exemplary comparator circuit that can form part of the sensor of FIG. 1.

FIG. 6 shows an exemplary window comparator 600 that can form a part of the fault detection module of FIG. 5. Resistors R1, R2, and R3 determine trip points of first and second comparators 602, 604. In an exemplary embodiment, a reference voltage resistor can be programmable by employing R/2R ladder DACs, which are well known in the art, to set the desired window thresholds for detecting the fault. The circuit can be programmed to trip under the short condition of FIG. 4 and the fault output FAULT becomes active when a short circuit current, for example, is detected by the comparators.

In one embodiment, the fault can be detected as a positive or negative value using the respective comparators 602, 604. In the illustrated embodiment, the comparator output is configured for active low operation. If the first or second comparators 602, 604 have an active output, a switch 606 is activated to bring the fault output FAULT to ground.

Figure 7:
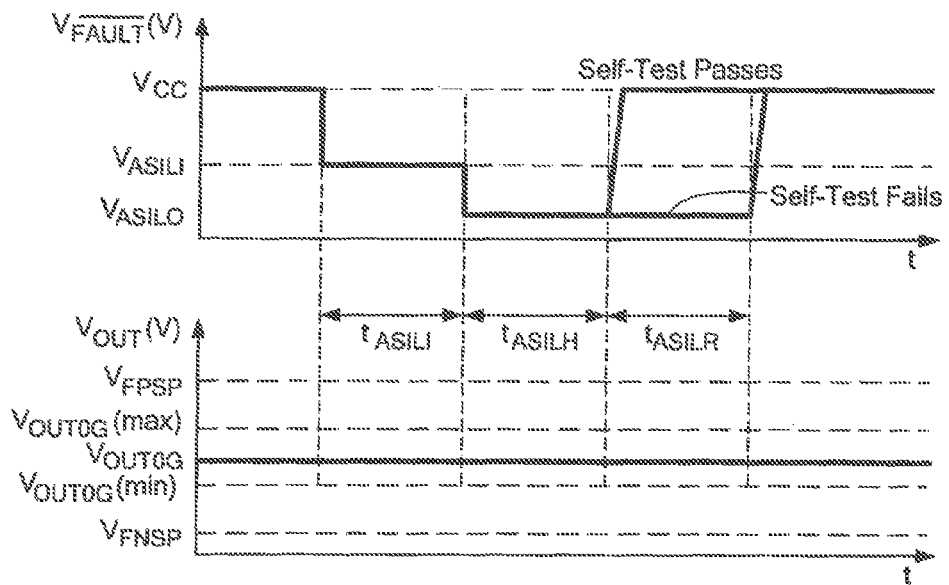
FIG. 7 is a timing diagram showing fault signal voltage and output voltage over time.

In one embodiment, the fault pin FAULT comprises an input/output pin that enables initialization of the self-test function, as shown in FIG. 7. During a time when the magnetic field is near zero, meaning no current flows in the application, and therefore no magnetic field, the FAULT output pin can be pulled to Vcc/2 to initiate self test of the fault detection functionality. In the illustrated embodiment, during time $t_{ASILI}$ the voltage on the FAULT pin is pulled Vcc/2, shown as $V_{ASILI}$. During time $t_{ASILH}$, self-test is performed. The device pulls the FAULT pin output low during this time to acknowledge the device received the command to initiate self-test during time tASILI During time $t_{ASILR}$, the results of the self-test are output on the FAULT pin, shown as Vcc for a self-test pass and $V_{ASILO}$ for self-test fail.

As noted above, and shown in FIG. 7, the output voltage Vout will be at $V_{OUTQG}$ when no magnetic field is present. During normal operation, the output voltage Vout can vary from a maximum $V_{OUTG(max)}$ and a minimum of $V_{OUTG(min)}$. VFPSP and VFNSP refer to the positive full scale output voltage and negative full scale output voltage.

Figure 8:
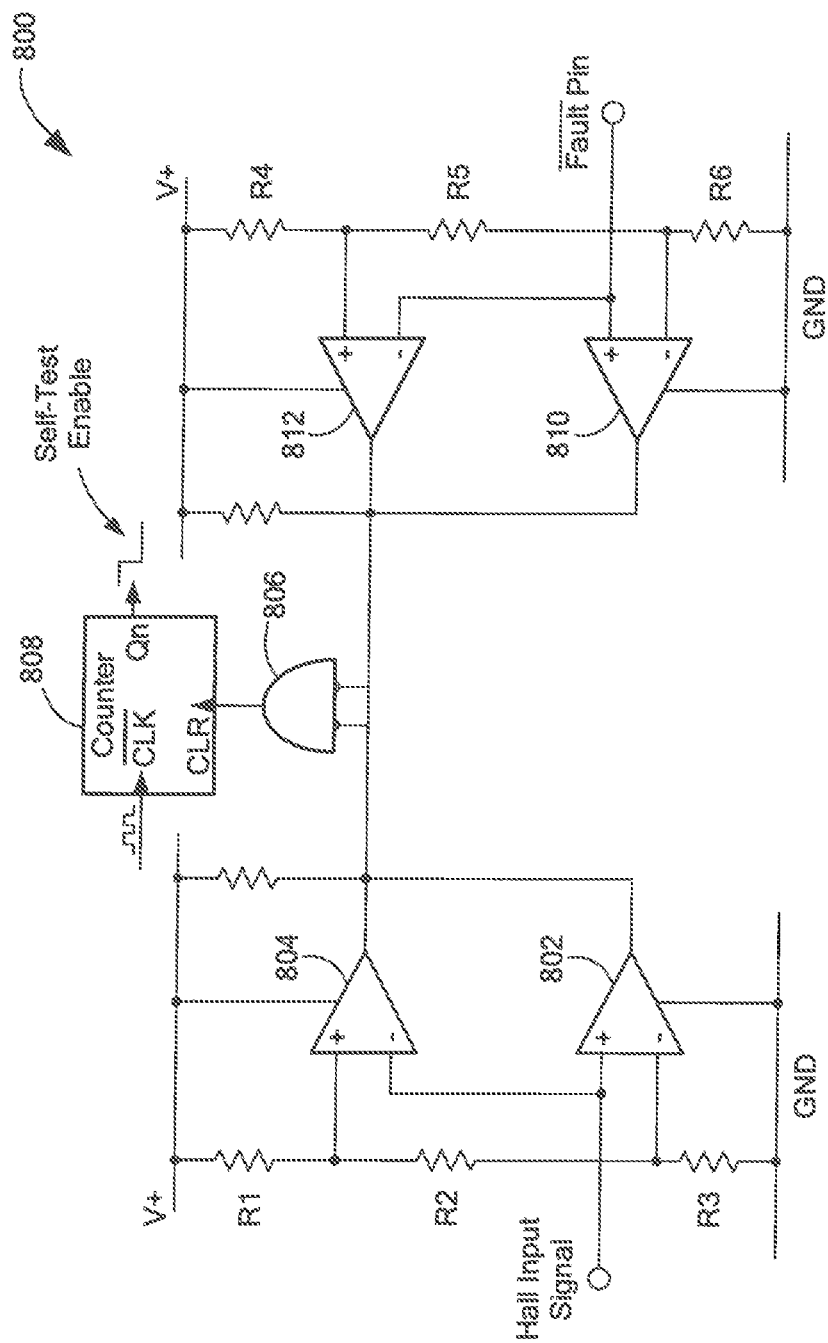
FIG. 8 is a circuit diagram of an exemplary circuit to detect a self-test initiation signal.

As shown in FIG. 8, the device can sense Whether the Fault pin has been pulled to about Vcc/2, shown as $V_{ASILI}$, at the beginning of time interval $t_{ASILI}$ in FIG. 7, and no magnetic field is detected by the Hall element. In the illustrated embodiment 800, a signal from the Hall element is provided to first and second comparators 802, 804, which have respective reference voltages defined by the values of R1, R2, and R3 that determine what is considered 'zero' magnetic field. That is, the magnetic field should be less than some value. In one embodiment, resistor R2 is adjustable for setting the comparator reference voltages, e.g., a programmable window comparator. The outputs of the comparators 802, 804 are provided to an input of an AND gate 806, of which the output is provided to a clocked counter 808. The Fault pin voltage is input to third and fourth comparators 610, 812, which have respective reference voltages determined by the values of R4, R5, R6. The comparator 810, 812 outputs are provided to the AND gate 806 input. With this arrangement, when the voltage from the Hall element is around zero, and the Fault pin is pulled to about Vcc/2, the self-test function is enabled after a time defined by the counter 808.

Figure 9:
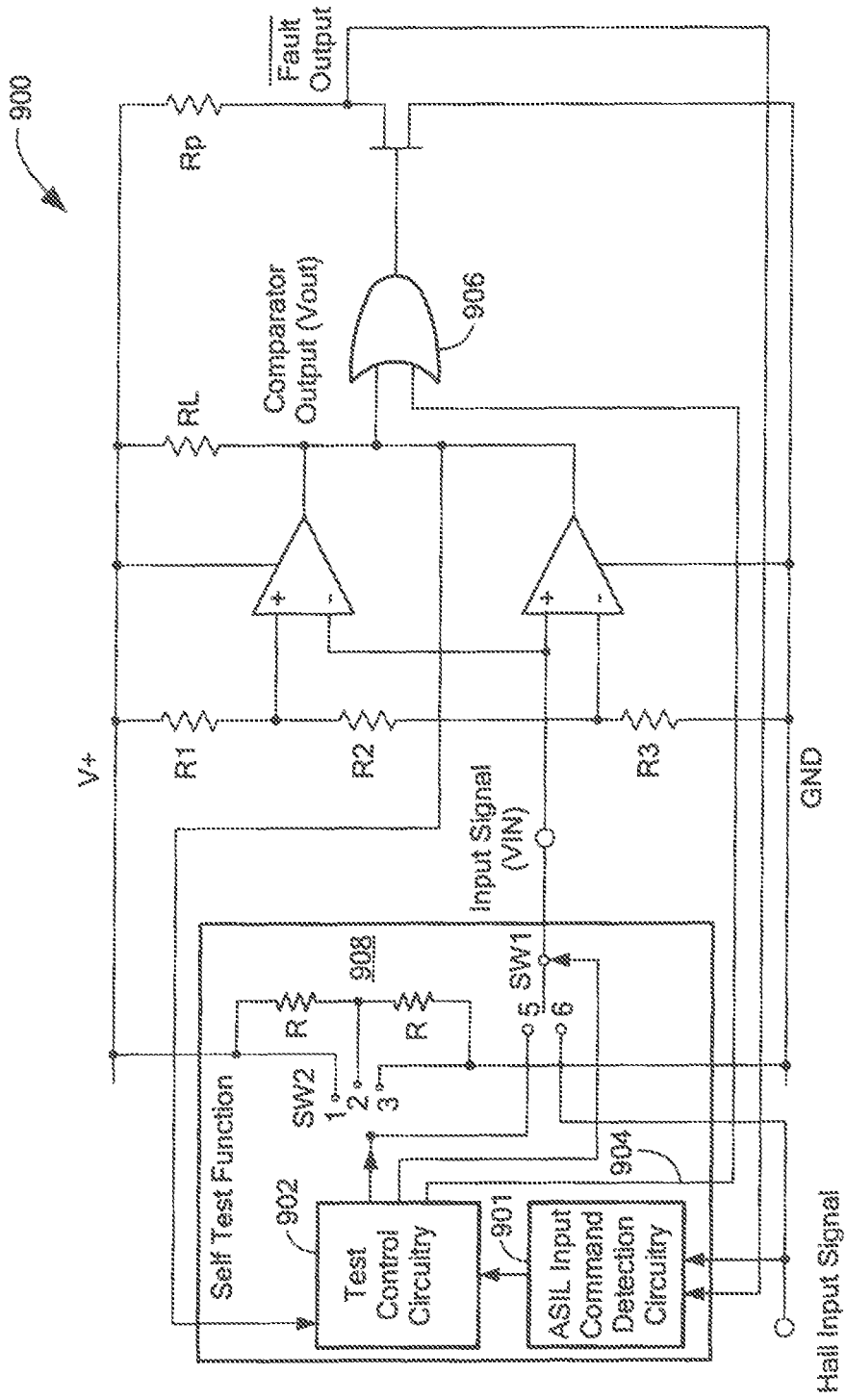
FIG. 9 is a circuit diagram of an exemplary fault detection and self-test module.

FIG. 9 shows an exemplary circuit implementation 900 of a fault detection module and self-test functionality. After a timeout period of the counter 808 (FIG. 8), shown as tASILI in FIG. 7, the device then enters the self-diagnostic mode. The counter 808 prevents noise or glitches from causing the part to go into the test mode. The timeout tASILI can be set for a desired period of time, such as a few microseconds. It is understood that the timeout tASILI can be set to any practical amount of time that is desirable to meet the needs of a particular application.

The sensor 'sees' that the self-test command was received by the output of the fault pin pulled to GND for time tASILH in FIG. 7. The chip 'sees' this because during a time when there is no magnetic field/current the FAULT output was held at Vcc/2 by for time tASILI from counter 808. The active pull down by the IC acknowledges that the command was received. If the output does not go low then the command to perform the self-test is not 'seen.' When control of the fault pin is released, the device takes control of the output pin and actively holds it to GND for time tASILH, which communicates that the self test command was received. The time tASILH should be long enough for the device to complete the diagnostic test in order to report the results during the time tASILR, as shown in FIG. 7.

In one embodiment, the self-test functionality is implemented as shown in FIG. 9. An ASIL input command detection module 901 can be configured as shown and described in conjunction with FIGS. 7 and 8. Once the ASIL command is detected, a test control module 902 pulls the FAULT output to GND with a control signal input 904 to an OR gate 906. The test control module 902 implements the following sequence of testing while maintaining the output low (see FIG. 7) by controlling the input to the OR gate.

During self-test, the test control module 902 closes switch position 5 of a first switch SW1 so the output of a 3-position second switch SW2. Under normal operation, the first switch SW1 has position 6 closed to receive the Hall signal.

The test control module 902 controls the second switch SW2 to one of position 1 (V+), position 2 (V+/2), or position 3 (GND). The test control module 902 cycles through these connections to verify that at SW2 positions 1 and 3 the output of the fault comparator is low (fault condition present), and that at position 2 the output of the fault comparator is high (no fault). In one embodiment, the switches SW1, SW2 are provided on the IC.

Once this sequence is completed the comparator circuitry has been tested and the results can be communicated after the timeout of tASILH (see FIG. 7). More particularly, if self-test fails the device can continue to pull the output FAULT low for a period of time tASILR. In an alternative embodiment, if the self-test fails the sensor can latch the failure on the output. In the illustrated embodiment, the device holds the fault output low for a selected period of time and releases the output to enable a resumption of normal operation and further self-test. For example, it may be desirable to re-run a self-test in the case where a failure due to a glitch or noise pulse resulting a false positive test.

If self-test is successful the device drives the output HI during time tASILR labeled as self-test passing in FIG. 7. Once the self-test result during time tASILR ends, test control module 902 releases the FAULT pin by reconnecting the Hall input voltage to the fault comparator by connecting to the first switch SW1 to position 6 and clearing the input to the OR gate to a logic low to assume normal operation.

With this arrangement, the device provides a self-test diagnostic that allows for each of the three states of the comparator to be tested. The self-test can improve the functional safety level of the entire system and allow improved levels of safety according to ISO26262, for example.

In one embodiment, in the event a sensed magnetic field increases above a given threshold as detected by the Hall circuitry, the device exits test mode.

In another embodiment, the device includes circuitry to test the accuracy of the programmed fault thresholds by controlling switch positions 1 and 3 voltages close to the programmed fault thresholds and testing a short distance away from both of the thresholds. For example, say the fault threshold is programmed to a value 200 mV below V+. References of V+−200 mV+/−x mV can be used to test that the comparator switches low at +x mV and does not switch at −x mV. The value 'x' in mV can be selected to meet the needs of a particular application. It is understood that the smaller the value of 'x', the more accurately the switchpoints are tested.

Figure 10:
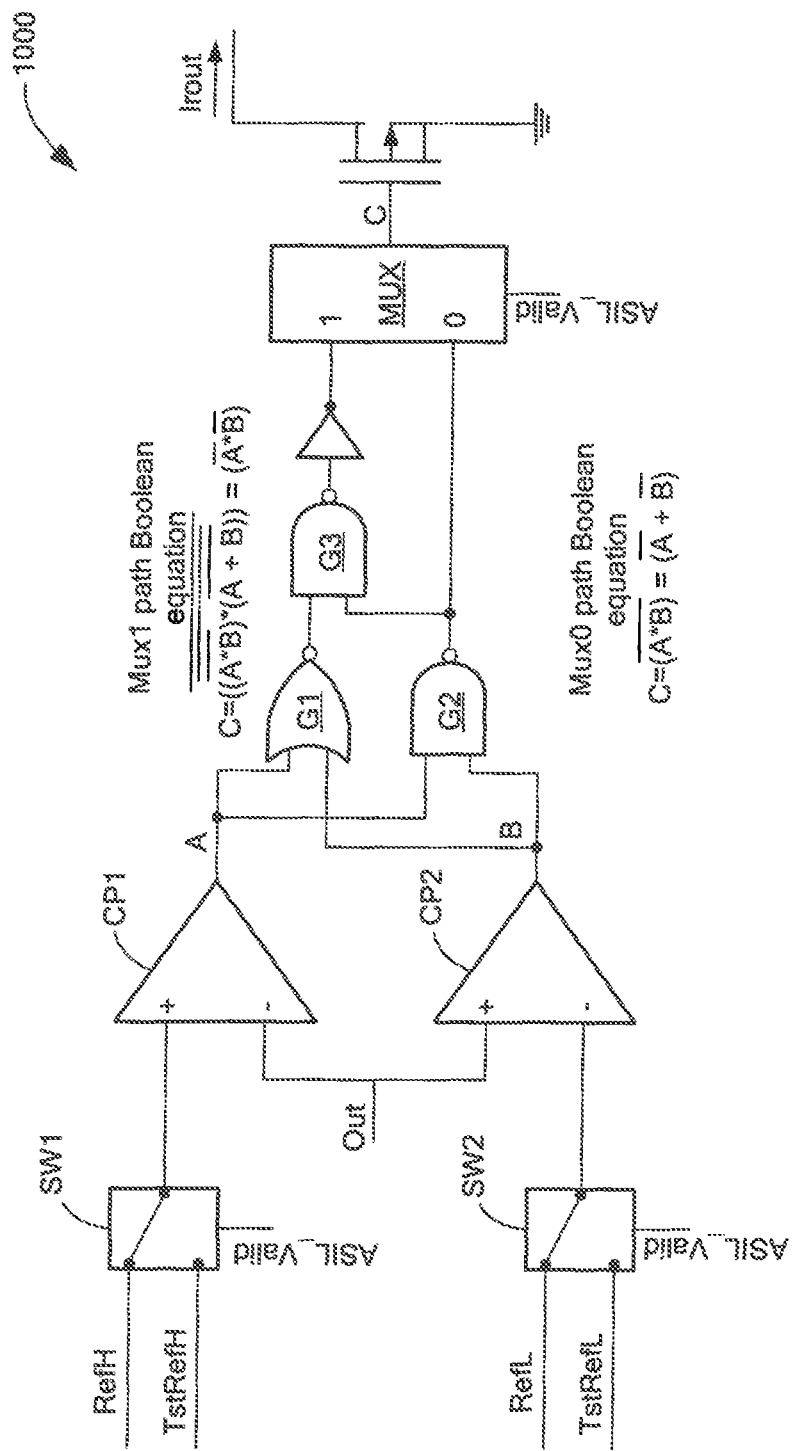
FIG. 10 is a circuit diagram an alternative self-test circuit.

An alternate embodiment 1000 of testing the window comparators is shown in FIG. 10 that tests in parallel instead of sequentially. The logic gates G1-3 and comparators CP1, CP2 must function correctly for the ASIL test to pass. During normal operation only the NAND gate G3 following the comparators CP1, CP2 is used in the Fault signal path. During normal Fault detection operation the window references RefH and RefL are used as thresholds to detect a fault condition. In ASIL test mode after the required time tASILI described above verifies that an ASIL test is being requested, the references are switched to TestRefH and TestRefL. Also, at that time, a MUX is switched to detect the alternate logic path. TestRefH and Test RefL need only be of a value that the comparators should trip as described above. In one embodiment, there is a cross connect of the two normal operation references such that TestRefH=RefL and TestRefL=RefH. This ensures that the comparators CP1, CP2 have outputs indicative of a Fault condition.

In normal Fault detection operation the switches SW1, SW2 are connected as shown and the ASIL_Valid signal is LO. The references RefH and RefL are set so that the comparator CP1, CP2 outputs are high if the device is operating in the desired output range. The Boolean equation indicated as Mux0 path is valid and point C goes high if either points A or B (the outputs of the comparators) go low indicating that a Fault has occurred.

During the ASIL test mode after the ASIL test request is valid for the period tASIL, the switches SW1, SW2 connect the comparator CP1, CP2 inputs to new reference levels TstRefH and TestRefL. The MUX 1 input is also connected to point C so the MUX 1 Boolean equation is valid in this ASIL test mode. Now both comparator CP1, CP2 outputs must be low for point C to go high. If the condition TstRefH<Out<TestRefL is met, the outputs of the comparators CP1, CP2 go low and if the logic gates are also functioning correctly then through the Boolean function C goes HI signaling that the comparators and the logic are functioning correctly.

Figure 11:
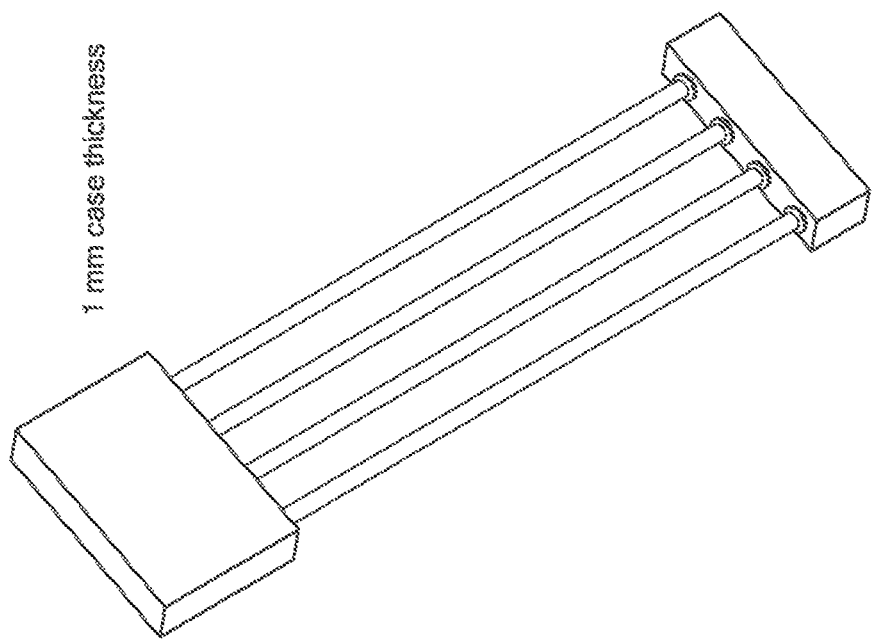
FIG. 11 is a schematic representation of an exemplary package for a current sensor.

FIG. 11 shows an exemplary device packaged in a 4 lead KT SIP. It is understood that the IC can comprise any suitable package. In one embodiment, the package has a thickness of less than about 1.1 mm. It is understood that it is desirable to minimize the thickness of the package.

It is understood that a variety of packages can be used to meet the needs of a particular application. For example, a package of the type shown and described in U.S. Pat. No. 6,781,359, which is incorporated herein by reference, can be used.

Figure 12:
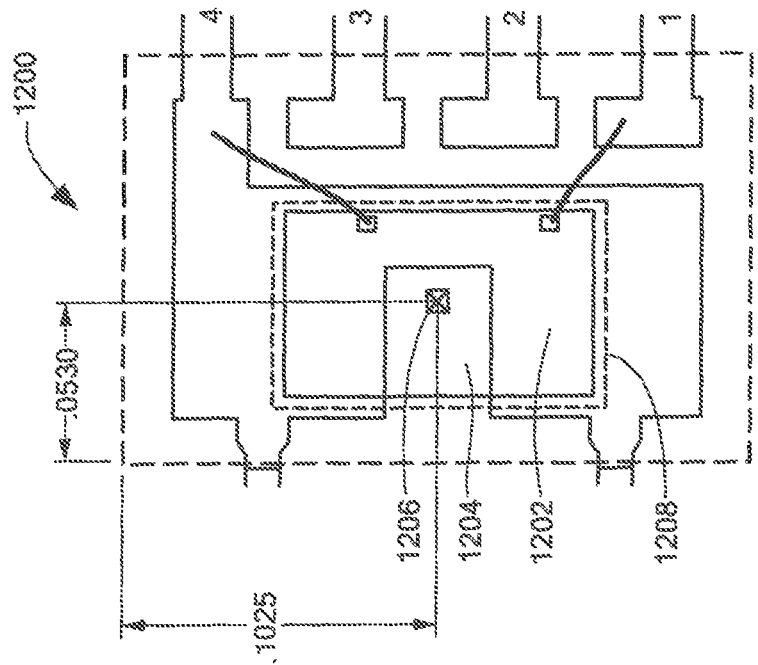
FIG. 12 is a schematic representation of a leadframe that can form a part of an IC.

FIG. 12 shows an exemplary split leadframe 1200 configuration in which a leadframe 1202 has a region 1204 cutout from the rest of the leadframe. A magnetic sensing element 1206 is located within the region 1204 to prevent Eddy current formation in the vicinity of the sensing element. A die 1208 can be supported by the leadframe.

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. An integrated circuit, comprising:
   a sensing element;
   fault detection module coupled to the sensing element, the fault detection module including circuitry to detect and output a fault condition and circuitry to perform self-test operation of the circuitry to detect the fault condition; and
   a fault pin to output the fault condition and to receive a self-test command,
   wherein the fault condition includes a magnetic field is above a first threshold and/or below a second threshold,
   wherein the self-test is terminated before completion when the magnetic field is above a flux threshold, and
   wherein the self-test operation is initiated only when the magnetic field is below a certain level associated with no magnetic field present.

2. The integrated circuit according to claim 1, wherein the sensing element comprises a magnetic sensing element.

3. The integrated circuit according to claim 2, wherein the magnetic sensing element comprises a Hall element.

4. The integrated circuit according to claim 2, wherein the magnetic sensing element comprises a magnetoresistance element.

5. The integrated circuit according to claim 1, wherein the fault condition includes a current level above a threshold.

6. The integrated circuit according to claim 1, wherein the integrated circuit comprises a linear current sensor.

7. The integrated circuit according to claim 1, wherein the integrated circuit comprises a magnetic field sensor.

8. The integrated circuit according to claim 1, wherein a self-test initiation signal comprises a given voltage level applied for at least a given time duration.

9. The integrated circuit according to claim 8, wherein the given voltage level comprises about vcc/2.

10. The integrated circuit according to claim 1, wherein the integrated circuit outputs a result of the self-test on the fault pin.

11. The integrated circuit according to claim 10, wherein the result comprises a voltage level indicative of pass/fail for the self-test.

12. The integrated circuit according to claim 1, wherein the fault detection module comprises a first comparator to detect a first fault condition and a second comparator to detect a second fault condition.

13. The integrated circuit according to claim 12, wherein the first fault condition includes a current level below a first threshold, and the second fault condition includes a current level above a second threshold.

14. The integrated circuit according to claim 1, wherein the integrated circuit comprises a package having exactly four pins.

15. The integrated circuit according to claim 1, wherein the integrated circuit comprises a package having a thickness of less than 1.1 mm.

16. The integrated circuit according to claim 1, wherein the fault detection module comprises a programmable window comparator.

17. The integrated circuit according to claim 1, wherein the integrated circuit comprises a linear current sensor.

18. The integrated circuit according to claim 1, further comprising a three-phase power system, wherein the integrated circuit is disposed in a core of an element in the three-phase power system.

\* \* \* \* \*